(12) United States Patent
Sarno et al.

(10) Patent No.: US 6,695,520 B1
(45) Date of Patent: Feb. 24, 2004

(54) DEVICE FOR INSERTING, EXTRACTING AND LOCKING A MODULE IN A BAY

(75) Inventors: Claude Sarno, Etoile sur Rhone (FR); Henri Bouteille, Beaumont les Valence (FR)

(73) Assignee: Thomson-CSF Sextant, Velizy Villacoublay (FR)

( * ) Notice: Subject to any disclaimer, the term of this patent is extended or adjusted under 35 U.S.C. 154(b) by 0 days.

(21) Appl. No.: 09/719,159

(22) PCT Filed: Jun. 4, 1999

(86) PCT No.: PCT/FR99/01322

§ 371 (c)(1),
(2), (4) Date: Dec. 12, 2000

(87) PCT Pub. No.: WO99/66772

PCT Pub. Date: Dec. 23, 1999

(30) Foreign Application Priority Data

Jun. 12, 1998 (FR) .............................. 98 07445

(51) Int. Cl.$^7$ ............................ H05K 7/14; E05C 5/00; H01R 13/64
(52) U.S. Cl. ............................ 403/11; 292/64; 292/66; 439/157; 439/153
(58) Field of Search .............................. 439/153, 157, 439/136; 292/118, 121, 52, 116, 66, 64, 71, DIG. 49, DIG. 31; 361/801

(56) References Cited

U.S. PATENT DOCUMENTS

| 1,545,804 A | * | 7/1925 | Warmerdam ................. 292/14 |
| 1,671,249 A | * | 5/1928 | Lieberman ................... 70/118 |
| 4,053,177 A | * | 10/1977 | Stammreich et al. ....... 292/113 |
| 4,124,184 A | * | 11/1978 | Juergens ...................... 292/66 |
| 4,506,439 A | * | 3/1985 | Roake ..................... 361/748 X |
| 4,975,073 A | * | 12/1990 | Weisman ..................... 439/157 |
| 5,414,594 A | * | 5/1995 | Hristake ..................... 439/153 |
| 5,873,745 A | * | 2/1999 | Duclos et al. .............. 439/157 |
| 6,019,620 A | * | 2/2000 | Kodama et al. ............ 439/157 |
| 6,120,309 A | * | 9/2000 | Hara ...................... 439/157 X |
| 6,312,273 B1 | * | 11/2001 | Hasegawa et al. .......... 439/157 |
| 6,315,586 B1 | * | 11/2001 | Joyce et al. ................ 439/157 |

FOREIGN PATENT DOCUMENTS

| DE | 4105948 A1 | * | 8/1992 | ........... H05K/7/14 |
| EP | 0 6990 19 | | 2/1996 | |
| EP | 780932 A1 | * | 6/1997 | |
| FR | 2588440 A1 | * | 4/1987 | |
| FR | 2 742 588 | | 6/1997 | |
| JP | 01076798 A | * | 3/1989 | |
| JP | 04220976 A | * | 8/1992 | |
| JP | 06224574 A | * | 8/1994 | |

* cited by examiner

Primary Examiner—Lynne H. Browne
Assistant Examiner—Ernesto Garcia
(74) Attorney, Agent, or Firm—Oblon, Spivak, McClelland, Maier & Neustadt, P.C.

(57) ABSTRACT

A device for inserting, extracting, and locking a module into, from, and in a rack. The device includes two arms which can pivot with respect to the module and which are articulated together by a common articulation, each of them including, on the one hand, at one end, an anchor for anchoring it into the rack and, on the other hand, a non-common articulation with the module. A device immobilizes one of the arms with respect to the other when the arms are anchored in the rack. Further, associated with at least one of the arms, an elastic device works in compression between the module and the arm when its end is anchored into the rack. Such a device may find particular application in electronics modules for avionics.

18 Claims, 6 Drawing Sheets

DEVICE FOR INSERTING, EXTRACTING AND LOCKING A MODULE IN A BAY

BACKGROUND OF THE INVENTION

The present invention relates to a device for inserting, extracting and locking a module into, from and in a rack, this module having to be connected to one or more connection elements when it is inserted into the rack. Connection may, in particular, be of the electrical type, and it is possible to envision for the connection to be of one or more other types, for example optical, mechanical, pneumatic, thermal, etc.

FIELD OF THE INVENTION

The description which will be given will apply to an electrical connection, but it could just as easily relate to a connection of some other type.

A module bearing one or more printed circuit boards is intended to fit into a rack in the manner of a drawer. The module has connection elements which plug together with other connection elements secured to the rack.

During insertion, the insertion, extraction and locking device has to overcome forces that are due to the connection elements. It has also to keep to a sequence of steps preceding connection proper, such as the pre-guiding of the module into the rack and decoding of the module to be sure that the module fitted is the right one and that its orientation is correct.

When the module is fully fitted into the rack, its printed circuit boards are connected to an electrical installation via the connection elements and the insertion, extraction and locking device, in its locked position, has to prevent accidental disconnection and provide a good connection even under severe conditions of use, for example in the face of significant vibrations, knocks, sharp accelerations, in a damp and/or saline environment, etc.

During extraction, the insertion, extraction and locking device has to allow the forces of unplugging the connection elements to be overcome.

The installations concerned may be, but are not exclusively, located on board heavier-than-air craft. In this application in particular, the safety of the connections is of prime importance; momentary breaks in the electrical or other connections may be particularly troublesome and dangerous in the case of real-time working, during data acquisition procedures or controlling parts of the heavier-than-air craft, etc.

There is an aim, particularly in integrated modular avionics systems, for the maintenance of such modules to be simple and effective. The modules have to be able to be installed quickly and their connection has to be extremely secure.

Quick disconnection and release of the modules has also to be possible, for repair or exchanges purposes.

An insertion, extraction and locking device is known, for example, from patent application FR 2 742 588. This comprises, secured to the module, a lever which can move in terms of rotation with, at one of its ends, a hook intended to catch on an anchoring pin connected to the rack, generally to its base, and secured to a spring. Being fixed to the rack at one end and to the anchoring pin at the other end, the spring exerts a return force directed toward the inside of the rack when the hook is caught on the anchoring pin. The other end of the lever comprises means for attaching the lever to the module. In the locked position, a remanent force is exerted on the connections as a result of the spring.

A device such as this is not entirely satisfactory. This is because in environmental conditions including strong vibrations, accidental disconnections may arise.

The insertion, extraction and locking device secures the module into the rack only by the hook at the base of the rack.

In the event of vibration, the module can oscillate in the rack. The rack generally comprises two slideways facing each other, one at the top and the other at its base, and the module is slid along these slideways. However, there is a certain amount of clearance provided between the module and the slideways in order to take account of tolerances on the module and those on the rack. Connections located at the back of the rack, on a diagonal with respect to the anchoring point, may therefore be disturbed if the module vibrates and begins to rock.

Another drawback of this insertion, extraction and locking device is associated with the size of the parts of the device supported by the base of the rack. The rack bears the spring and the hook anchoring pin. Space has to be made to house these parts and this space encroaches on the volume for storing the modules. The printed circuit boards housed in the modules have a smaller surface area than boards placed in modules associated with insertion and extraction devices in the form of simple levers but which do not fulfil the function of permanently maintaining the load.

It has also been found that this insertion, extraction and locking device cannot guarantee correct and complete connection of the module upon each insertion. If there is abnormal or excessive resistance in the connector blocks or if any obstacle arises during insertion, the return spring may completely compress and the lever may be locked without the module being completely and reliably fitted into the rack. There is a risk that the connections will be strained or damaged without the operator who has just performed this incorrect operation noticing.

DISCUSSION OF THE BACKGROUND

The object of the present invention is to offer a particularly reliable insertion, extraction and locking device which guarantees undisrupted connection when operating in a harsh environment.

Another object of the present invention is to offer an insertion, extraction and locking device which prevents any incorrect or incomplete connection of the module.

Another object of the present invention is to offer an insertion, extraction and locking device which is compatible with standard modules and existing racks.

In order to achieve this, the present invention is a device for inserting, extracting and locking a module into, from and in a rack, comprising:

two arms which can pivot with respect to the module and which are articulated together by a common articulation, each of them comprising, on the one hand, at one end, means of anchoring it into the rack and, on the other hand, a non-common articulation with the module, means capable of immobilizing one of the arms with respect to the other when both of the arms are anchored in the rack, and associated with at least one of the arms, elastic means working in compression between the module and the said arm when its end is anchored into the rack.

The elastic means may comprise one or more elements such as springs or Belleville washers.

When use is made of Belleville washers, these may form one or more packets, each comprising one or more first Belleville washers mounted a first way round, and one or more second Belleville washers mounted a second way round, the first way round being the opposite of the second, so as to obtain a stiffness which is perfectly tailored to the module and to the forces it experiences.

According to a first configuration of the insertion, extraction and locking device, the non-common articulation specific to one arm may comprise a clevis secured to the module, this clevis having two branches which support a pivot passing through a slot in the arm.

According to another configuration, the non-common articulation specific to one arm may comprise a pivot which projects from the module through a slot in the said arm, the arm being held on the pivot by a pin which can be prevented from translational movement.

A certain amount of clearance is preferable at a non-common articulation so as to make the insertion, extraction and locking device easier to manipulate.

The elastic means may be located at a non-common articulation or more simply may be offset therefrom.

The anchoring means may be a two-pronged fork, these prongs straddling a boss borne by the rack upon anchoring.

To assist with the insertion and extraction of the module, it is preferable for the prongs to have different lengths, the shorter prong being received between the boss and the module.

The common articulation may be of the hinge type. To make the insertion, extraction and locking device easier to manipulate, it is preferable for it to leave a clearance between the two arms.

The means capable of immobilizing one of the arms with respect to the other may comprise a notch borne by one of the arms and a hook integral with the other arm, the hook being inserted in the notch.

To avoid accidental disengagement of these immobilizing means, provision may be made for the hook to be kept inserted in the notch by elastic means.

BRIEF DESCRIPTION OF THE DRAWINGS

The present invention will e better understood from reading the description of some embodiments which is illustrated by the figures which depict.

BRIEF DESCRIPTION OF THE DRAWINGS

Figure 1:
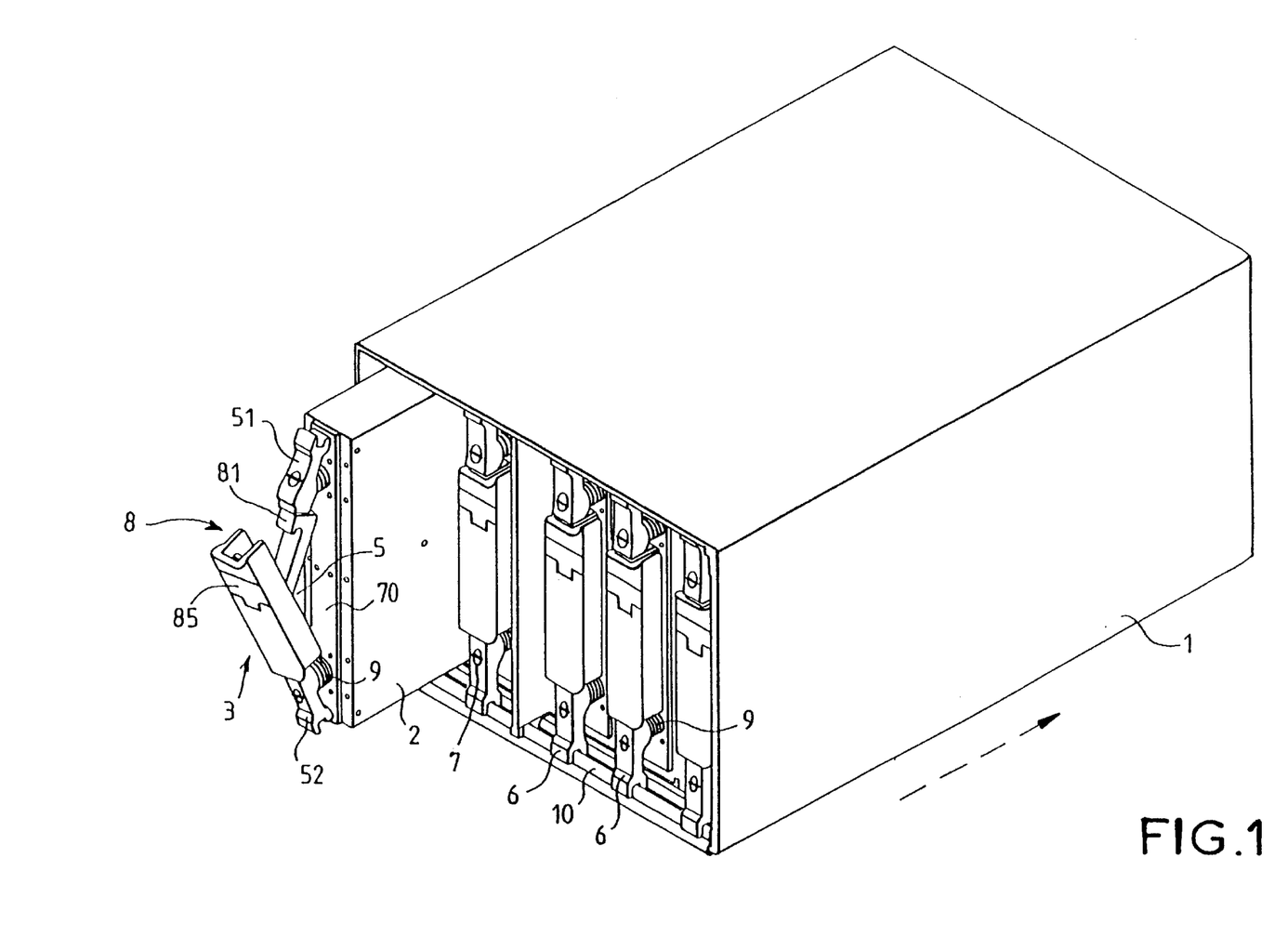
FIG. 1: a rack into which modules equipped with insertion, extraction and locking devices according to the invention are fitted.

FIG. 1 is a view from the front, in perspective, of a rack 1 containing five modules 2 equipped with the insertion, extraction and locking device 3 according to the invention. These modules 2 are removable and have a geometry tailored to that of the rack. The rack 1 comprises, in the conventional way, guide means 4 arranged opposite each other, for example U-shaped slideways. These guide means 4 are visible only in FIG. 2, but because the figures are longitudinal sections, the U-shape is hidden.

The left-hand module 2 is not fully fitted into the rack 1 and the insertion, extraction and locking device 3 according to the invention is in the unlocked position. The other modules 2 are fully fitted into the rack 1 and connected into the back of the rack 1 (at its rear face) and the insertion, extraction and locking devices 3 are in a locked position.

Details of the connection of the modules to the back of the rack will be given in FIG. 4.

The structure of the insertion, extraction and locking device 3 according to the invention will now be described with particular reference to FIG. 2a. The module 2 is depicted truncated and hatched. The rack 1 is seen only via its upper face 1.1 and lower face 1.2.

The insertion, extraction and locking device according to the invention comprises two arms 51, 52 which can pivot with respect to the module, connected together by a common articulation 5. These arms 51, 52 each comprise, at one of their ends, means 6 of anchoring it into the rack 1. Each arm 51, 52 also comprises a non-common articulation 7 which connects it to the module 2 and allows pivoting with respect to the module 2. This articulation 7 is located between the common articulation 5 and the anchoring means 6. The insertion, extraction and locking device 3 also comprises, collaborating with the two arms 51, 52, means 8 capable of immobilizing one of the arms 51, 52 with respect to the other when the anchoring means 6 are anchored in the rack 1 and the module 2 is connected and secured to the rack 1. This position is illustrated in FIG. 2e and is the locked position of the insertion, extraction and locking device according to the invention. These means 8 capable of immobilizing one of the arms with respect to the other are independent of the module 2.

The insertion, extraction and locking device 3 according to the invention also comprises, associated with at least one of the arms 51, 52, elastic means 9 working in compression and inserted between the module 2 and the corresponding arm 51, 52. They exert on the module 2 a return force F toward the inside of the rack 1 when the insertion, extraction and locking device 3 is in the locked position. The arrows F are visible in FIG. 2e.

The anchoring means 6 are depicted in the form of a fork. They are fixed with respect to the arms. Each of the forks 6 has two prongs 61, 62 and is intended to collaborate with the rack 1 at a boss 10 depicted in the form of a rail. The two prongs 61, 62 straddle the rail 10 when anchoring is performed. The rails 10 are placed inside the rack 1, one of them on its upper face 1.1 and another on its lower face 1.2, and are oriented substantially transversely to the direction of insertion of the module 2 into the rack, this direction being embodied by an arrow in dotted line in FIG. 1. This figure shows only the lower rail 10 and is common to the various insertion, extraction and locking devices. This configuration is nonlimiting.

To make it easier for the module 2 to be extracted from the rack 1 and also to make its insertion easier, it is preferable for the prongs 61, 62 of the fork 6 to have different lengths. The usefulness of this feature will be explained later on when explaining the various phases of movement given to the insertion, extraction and locking device 3.

To make the insertion, extraction and locking device easier to manipulate, it is preferable that the non-common articulation 7 specific to each of the arms 51, 52 should afford a certain amount of clearance between the arms 51, 52 and the module 2. This articulation 7 may comprise a pivot 53 secured at one end to the module 2 and the other, free, end of which projects through a slot 54 in the arm 51, 52.

Figure 3A:
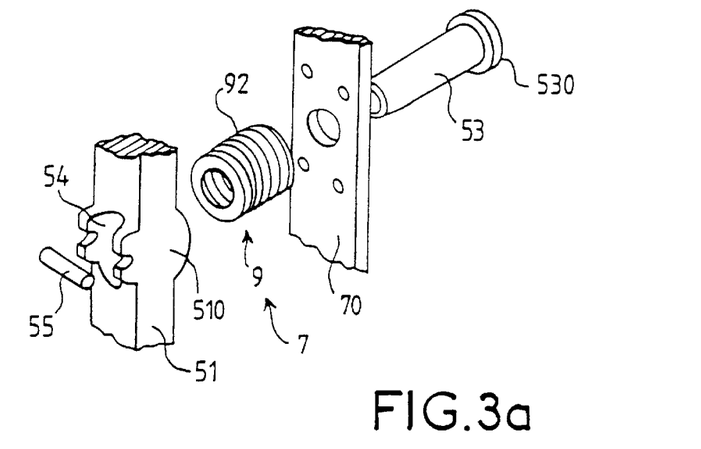
FIGS. 3a, 3b: two views of the non-common articulation specific to one arm of an insertion, extraction and locking device according to the invention.

The pivot 53 is depicted in FIG. 3a as a stepped pivot. It passes through a plate 70 intended to be fixed to the module by screws, for example. The step 530 is then received between the module 2 and the plate 70. A pin 55, which can be prevented from translational movement, passes through the pivot 53 at its free end to keep the arm 51, 52 slipped over the pivot 53.

Figure 3B:
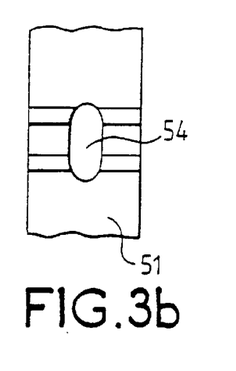

The slot 54 preferably has a surface area greater than the cross section of the pivot 53, so as to give the arm 51, 52 the required clearance to allow ease of pivoting. A slot 54 of oblong shape, visible in FIG. 3b, the major axis of which is oriented along the main axis of the arm 51, 52, for example, may leave the arm 51 free to move up, allowing the fork 6 to sit over the rail 10.

Figure 5A:
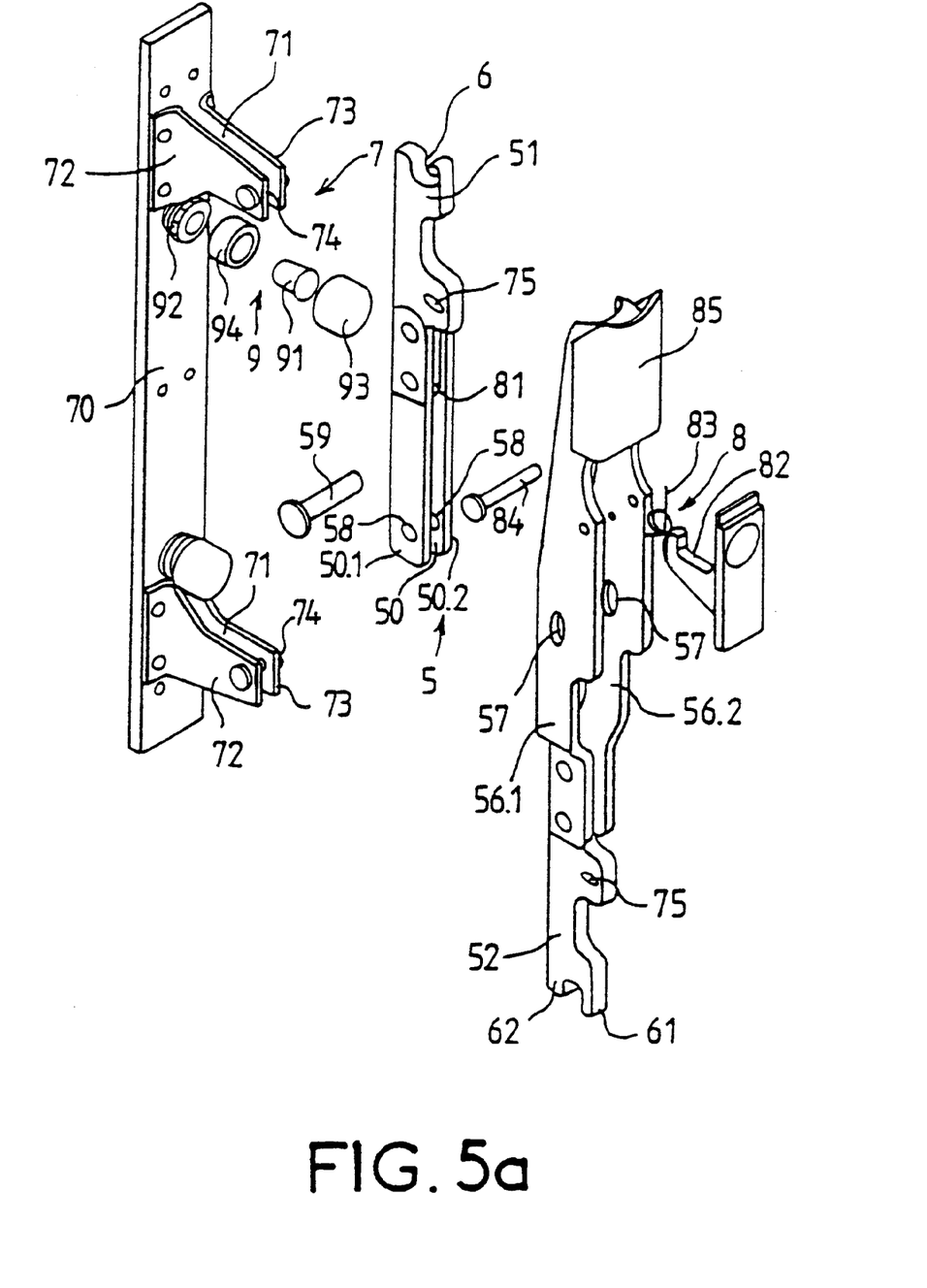
FIGS. 5a, 5b, 5c: exploded, side and sectioned views, respectively, of an alternative form of insertion, extraction and locking device according to the invention

In FIG. 5a, which shows an exploded view of an alternative form of insertion, extraction and locking device 3 according to the invention, the non-common articulation 7 comprises a clevis 71 secured to the module 2, this clevis 71 having two arms 72, 73 which support a pivot 74 for the arms 51, 52. The arm 51, 52 is received between the two branches 72, 73 of the clevis 71. At the non-common articulation 7, the arm 51, 52 comprises a slot 75 through which the pivot 74 passes. This pivot 74 may, for example, be a screw and a self-locking nut.

The slot 75 preferably has a surface area greater than that of the cross section of the pivot 74, so as to give the arm 51, 52 the desired clearance allowing it easily to adopt an inclination. A slot 75 of oblong shape, with the major axis oriented essentially transversely to the main axis of the arm 51, 52, allows the desired clearance to be obtained.

In the example described, the two branches 72, 73 of the clevis 71 are brackets mounted symmetrically with respect to the main plane of the arm 51, 52. These branches 72, 73 are fixed on a plate 70 of the same kind as the one described in FIG. 3a.

Figure 3C:
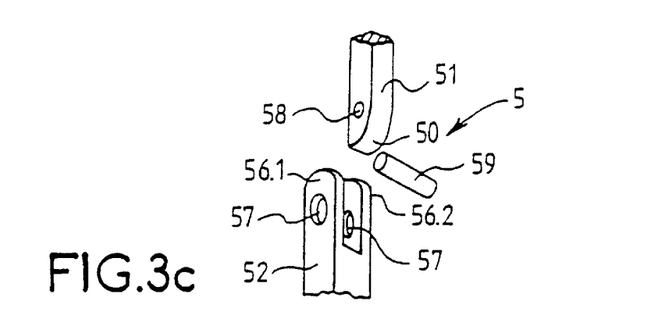
FIG. 3c: an exploded view of the articulation common to the two arms of an insertion, extraction and locking device according to the invention.

One example of a common articulation 5 is depicted in FIG. 3c; this articulation 5 is of the hinge type.

One of the arms 52 ends in two branches 56.1, 56.2 each having a slot 57, the two slots 57 being opposite each other. The other arm 51 ends in a part 50 which is received between the two branches 56.1, 56.2; it too is equipped with at least one slot 58. A stud 59 which can be prevented from translational movement forms the hinge pin by passing through the slots 57, 58. It is also preferable to leave the two arms 51, 52 a certain amount of clearance at the common articulation 5 to make the device that is the subject of the invention easier to operate. The slots 57 in the arm 52 or the slot 58 in the arm 51 preferably have a surface area greater than that of the cross section of the stud 59. In FIG. 3c, for example, the slots 57 are depicted oblong with the major axis oriented along the main axis of the arm 52, so as to give the two arms 51, 52 the desired clearance.

In FIG. 5a, the common articulation 5 is entirely comparable with what has just been described. However, a slight difference exists and is associated with the structure of the means 8 capable of immobilizing one of the arms 51 with respect to the other 52. One of the arms 52 still ends in two branches 56.1, 56.2. At the common articulation side, the part 50 of the other arm 51 is split into two branches 50.1, 50.2 to accommodate an element of the means 8 described later. These two branches 50.1, 50.2 each have a slot 58, and these slots face each other. Once again, there is the clearance between the arms 51, 52 and obtained via oblong slots 58, 57 on one of the arms 51, 52.

In the examples described, elastic means 9 are associated with each of the arms 51, 52. The elastic means 9 are located, in FIGS. 2 and 3a, at the non-common articulation 7 specific to each of the arms 51, 52, while in FIG. 5 they are offset with respect to the non-common articulations 7.

Figures 2A, 2B, 2C, 2D, 2E:
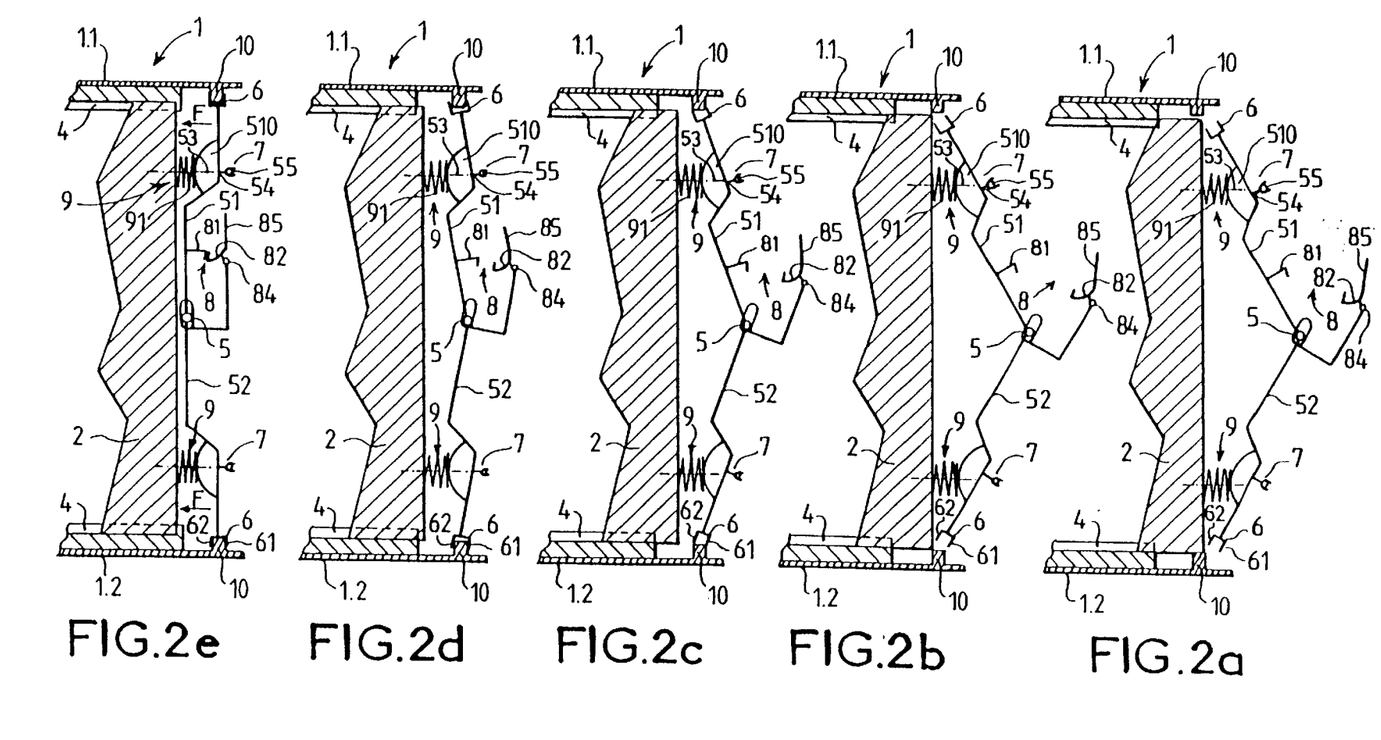
FIGS. 2a to 2e: diagrammatic cross sections of one example of an insertion, extraction and locking device according to the invention, from its unlocked position to its locked position.

In FIG. 2, the elastic means 9 are mounted so that they can slide along the pivot 53 and comprise one or more springs 91. These springs 91 work in compression by resting, at one end, against the corresponding arm 51, 52 and, at the other, against the module 2. The characteristics and number of springs are chosen to suit the forces to which the device according to the invention will be subjected.

FIG. 3a shows an exploded view of an alternative form of the elastic means 9. These now comprise one or more Belleville washers 92 which slide about the pivot 53. They are located in this FIG. 3a between the plate 70 and the corresponding arm 51. This alternative form makes it possible, by choosing the number of washers 92 and the way round in which they are mounted, to achieve practically the desired theoretical stiffness. In order to take account of the pivoting movement that each of the arms follows during anchoring, provision is made for each of the arms 51, 52 to have a rounded boss 510 in the region in which the elastic means 9 press. The elastic means 9 come into abutment against this boss 510 regardless of the position of the arms 51, 52.

Figure 5B:
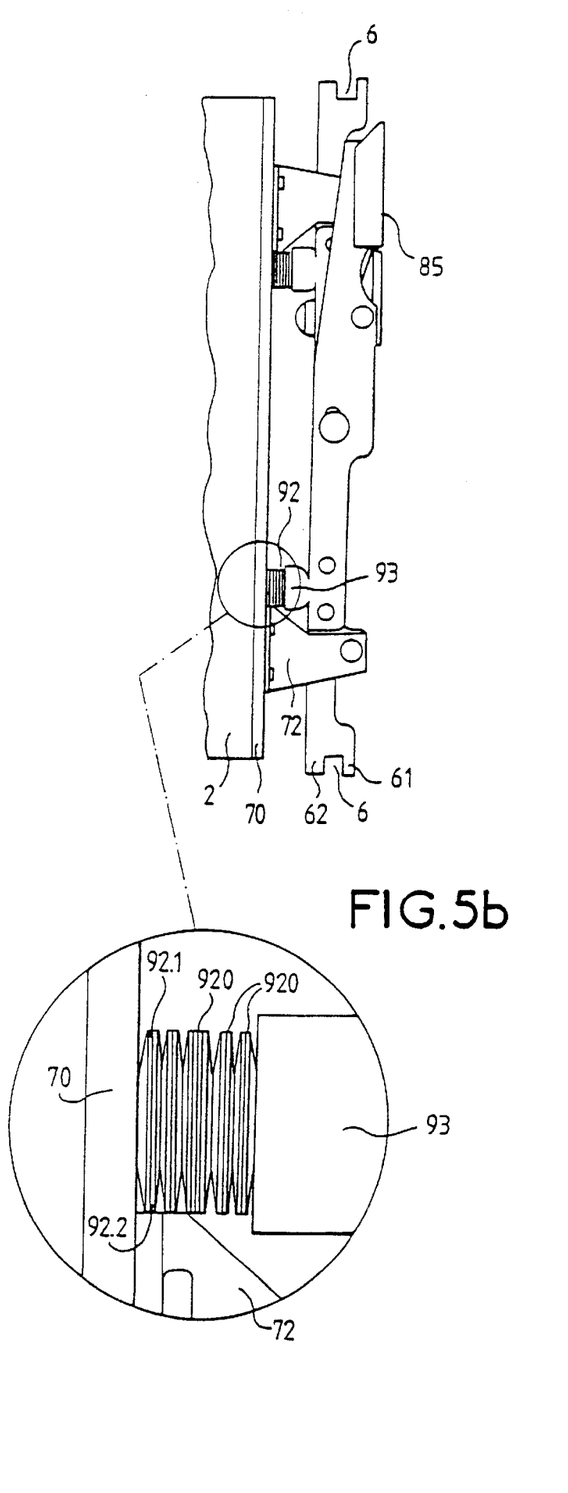

In FIG. 5b, a detail on the zone of the Belleville washers 52 shows a succession of packets 920 of Belleville washers 92. In the example, the packets 920 do not all contain the same number of washers. One packet 920 contains one or more first Belleville washers 92.1 mounted a first way round, and one or more second Belleville washers 92.2 mounted a second way round, the first way round being the opposite to the second. In the example, there are five packets 920 of Belleville washers; all except one comprise one first Belleville washer 92.1 and one second Belleville washer 92.2, and the central packet 920 itself comprises two first Belleville washers 92.1 and two second Belleville washers 92.2. Other arrangements would be entirely possible.

Such elastic means, whether they comprise springs or Belleville washers, can easily be tailored to suit any size of module regardless of the forces to which they are subjected.

Figure 5C:
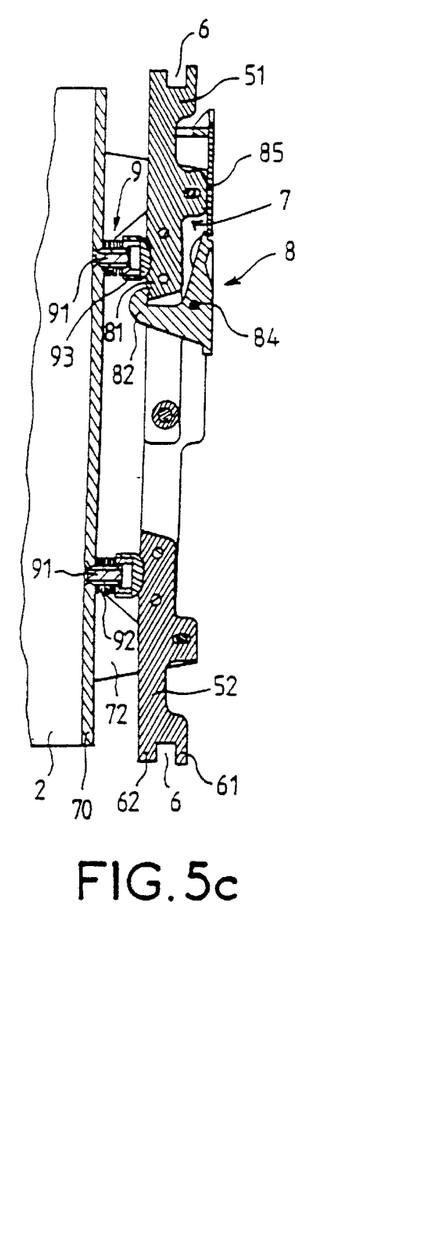

In FIG. 5, the elastic means 9 associated with one arm 51, 52 are now offset with respect to the non-common articulations 5, which is simpler to produce. This configuration additionally has the advantage of eliminating the friction force and therefore of making insertion and extraction easier. This furthermore makes it possible to create a couple, the force of which has the effect of causing both arms 51, 52 to pivot and of allowing them to be grasped by hand. The elastic means 9 now slide on a pin 91 which has a base secured to one of the two elements chosen from the module 2 or the arm 51, 52, and a free end which projects toward the other element and is capped with a cap 93 that can move in translation. Slipped onto this pin 91 are the elastic means which in this instance are Belleville washers 92. It is via the cap 93 that the elastic means 9 are compressed. When the cap 93 comes into abutment against the arm 51, 52 or the module 2, it slides up closer to the base of the pin and compresses the elastic means 9. It spreads the loads over the elastic means uniformly. In FIG. 5a, the cap 93 has its base secured to a ring 94 which slides along the pin 91 and acts as an interface between the elastic means and the cap.

The means 8 capable of immobilizing one of the arms 51, 52 with respect to the other are produced by a first element, for example a hook 82 which can collaborate with a second element, for example a notch 81. The hook 82 is secured to one of the arms 52 and the notch 81 is secured to the other 51.

Thus, for example, the means 8 for immobilizing the two arms 51, 52 with respect to each other comprise a notch 81 borne by one of the arms 51, 52 and a hook 82 integral with the other arm. The hook being inserted in the notch 81.

In FIG. 2, the notch 81 is located between the non-common articulation 7 specific to the arm 51 and the common articulation 5. The hook 82 is located at the opposite end from the non-common articulation 7 specific to the arm 52 with respect to the common articulation 5. In the example, the hook 82 can move with respect to the arm 52; it is mounted so that it can rotate about a pin 84 so that it can easily be hooked and unhooked.

The means 8 capable of immobilizing one of the arms 51, 52 with respect to the other comprise elastic means 83 to prevent accidental disengagement of the hook 82 from the notch 81. These elastic means 83 may be formed by the elastic material of the hook or, as a preference, by a spring working in torsion which tends to constantly return the hook 82 to an angular position corresponding to the hooked position. The hook 82 may be extended by a pusher 85 which, when actuated, opposes the return force of the spring 83 working in torsion. This structure is illustrated in FIG. 3d.

Figure 3D:
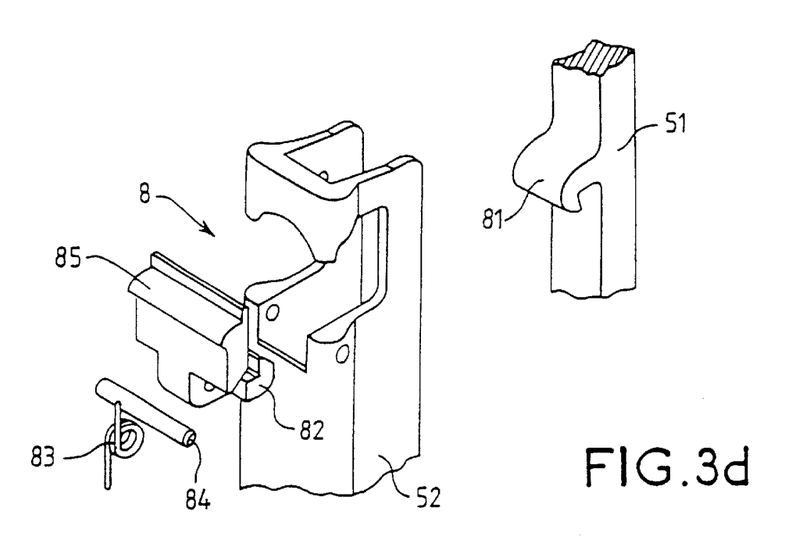
FIG. 3d: an exploded view of the means for immobilizing one arm with respect to the other of an insertion, extraction and locking device according to the invention.

In FIG. 5a, the means 8 capable of immobilizing one of the arms with respect to the other are entirely comparable with what was presented in FIG. 3d. The notch 81 is located between the two branches 50.1, 50.2 of the arm 51. The arm 51 in this example is configured as two sections placed end to end, the first at one end bearing the anchoring means 6 and being sandwiched at the other end between the two branches 50.1, 50.2 which form the second section. The notch 81 is at the end of the first section between the two branches.

An insertion, extraction and locking device such as this with its two arms pivoting with respect to the module, articulated to one another, has the advantage that it can be used easily as a handle for manipulating and/or transporting the module.

The sequence of steps that lead to the insertion, extraction and locking device according to the invention and to the connecting of a module will now be seen. These steps are illustrated in FIGS. 4a to 4e to be combined with FIGS. 2a to 2e which diagrammatically show the positions adopted by the insertion, extraction and locking device in its entirety.

In FIGS. 4a to 4e, there are two circles drawn per step, the left-hand circles giving, for each step, the position of one of the arms 52 (the bottom arm) in the region of its anchoring means 6, and the right-hand circles giving the position of the module 2 in the rack 1.

Figure 4A:
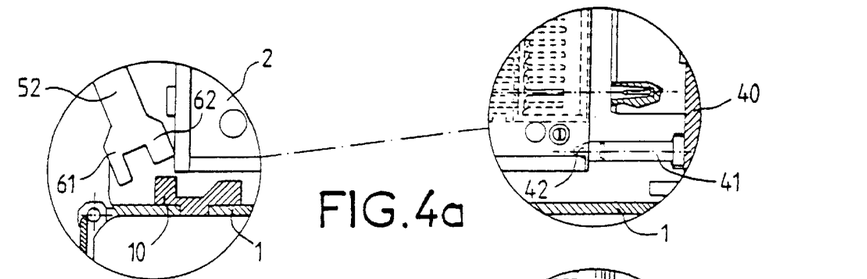
FIGS. 4a to 4e: the positions adopted by the anchoring means of an insertion, extraction and locking device according to the invention and by the module at the back of the rack, between the locked position and the unlocked position.

The first step which corresponds to FIGS. 2a and 4a is a step of centering the module. The module 2 is introduced into the rack 1 then shifted in translation, pushing it by hand, so that it slides in the guide means 4, (not depicted in FIG. 4). The back 40 of the rack 1 has centering pegs 41 which project toward the module 2 and are intended to enter a housing 42 borne by the module 2.

In the conventional way, provision may be made for each module 2 to comprise two housings 42 each intended to accommodate a centering peg 41 and for these two centering pegs to be given different dimensions so as to prevent the module from being inserted the wrong way. This feature is not visible in the figures, the other centering peg would be placed at the top of the rack.

The insertion, extraction and locking device is in the open position with its arms 51, 52 inclined. Its anchoring means 6 are not collaborating with the rail 10 of the rack 1. The elastic means 9 are not compressed (see FIG. 2a). The centering peg 41 and the guide means 4 contribute to centering the module 2 in the rack 1.

Figure 4B:
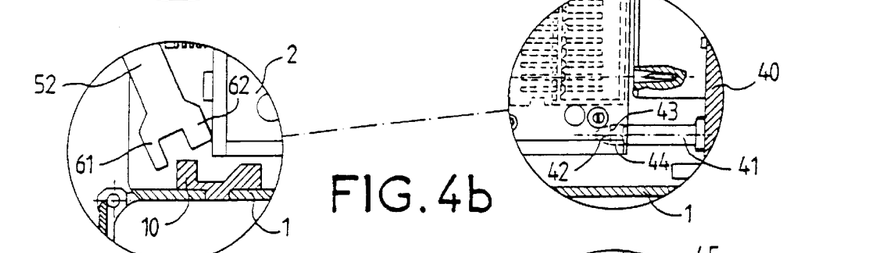

The next step illustrated in FIGS. 2b and 4b is a classic polarizing step. The bottom 40 of the rack 1 comprises polarizing means 42 in the form of a stub which is shorter than a centering peg 41. These are intended to enter a housing 44 borne by the module 2. The geometry of the cross section of the housing 44 corresponds to that of the cross section of the stub 43.

The various modules 2 which are to be inserted into the rack will have housings 44 of different geometries so as to prevent a module from being inserted in a space not intended for it.

In FIGS. 4a to 4e, the stubs 43 are depicted behind the centering pegs 41, which means that only their end, shown in dotted line, can be seen.

This polarizing step is obtained by continuing to move the module 2 in translation to bring it closer to the back 40 of the rack 1. The arms 52, 51 of the insertion, extraction and locking device are still inclined and free.

Figure 4C:
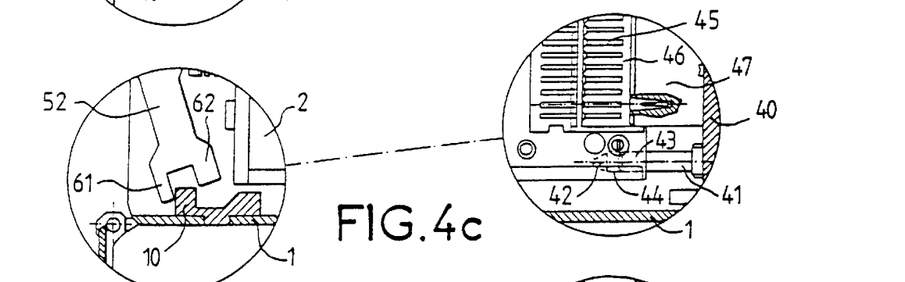

The next step illustrated in FIGS. 2c and 4c is a step of centering the connections. The module 2 comprises, in housings 46, connector blocks 45 of a first type connected to the printed circuit boards which are to be inserted into connector blocks 47 of a second type connected borne by the rack. In the example, the connector blocks 45 of the first type have female contacts and the connector blocks of the second type have male contacts.

During this step, the connector blocks 47 of the second type are offered up to the edge of the housings 46. No connection is made at this stage. The arms 51, 52 still have roughly the same inclination and the anchoring means 6 come into contact with a rail 10. It has been seen that the anchoring means 6 were formed of a two-pronged fork with prongs 61, 62 of different lengths.

The shorter prong 62 is intended to sit between the rail 10 and the module 2 while the longer prong 61 sits on the other side of the rail 10. During this step, the longer prong 61 jams against the rail 10 but the module 2 is not yet at the end of its travel.

Figure 4D:
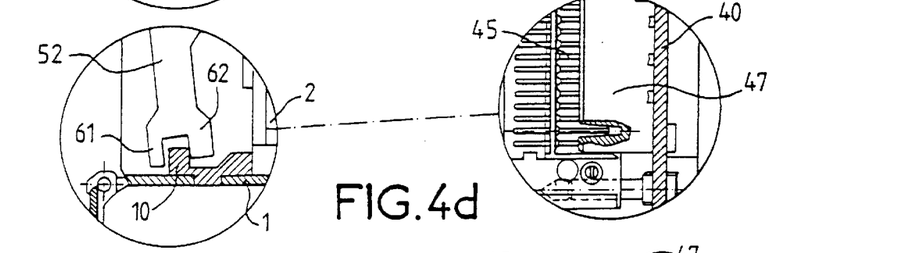

The next step consists in straightening the two arms 51, 52 roughly simultaneously by action on their common articulation 5. This step, illustrated in FIGS. 2d and 4d, is the one that makes the connections. The connector blocks 47 of the second type and those 45 of the first type couple. By causing the two arms 51, 52 to pivot in order to straighten them, the anchoring means 6 engage on the rail 10, the shorter prong 62 grips the rail. When the arms 51, 52 are straightened and anchored, the elastic means 9 are in compression and the module 2 is at the end of its travel in abutment against the back of the rack. Anchoring both arms simultaneously by virtue of the common articulation guarantees that the module is perfectly connected and firmly held in the rack.

As soon as the arms 51, 52 are straight, the elastic means 9 compress and contribute to overcoming the force necessary for connection by exerting on the module 2 a return force toward the inside of the rack 1. This force may be substantial; it is of the order of 100 grams per contact and the number of contacts may exceed 100.

Figure 4E:
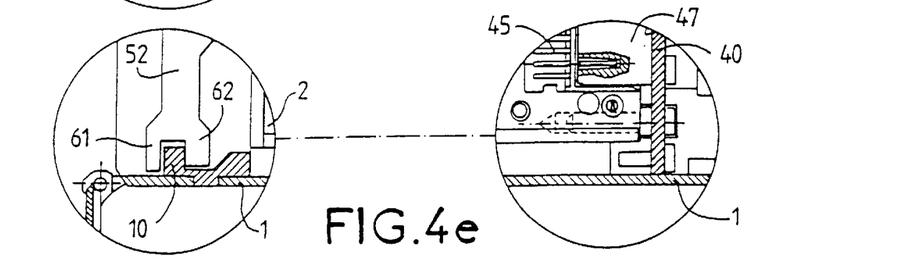

The last step illustrated in FIGS. 2e and 4e is that of locking the insertion, extraction and locking device. The module remains immobile. The means 8 capable of immobilizing one of the arms 51, 52 with respect to the other are activated. The hook 82 is inserted into the notch 81. The elastic means 9 are still in compression, which thus guarantees the quality of the connections regardless of the environment.

The insertion, extraction and locking device according to the invention is multifunctional; it makes it possible to scale down the effort of insertion and that of maintaining the locked position.

When the insertion, extraction and locking device is unlocked, after disengagement of the hook 82 from the notch 81, the anchoring means 6 remain temporarily engaged with the rail 10, while the arms 51, 52 begin to tilt. The elastic means 9 relax and play a part in uncoupling the connector blocks 45, 47 of first and second type. The more the arms 51, 52 tilt, the more the module 2 disengages from the rack 1. The shorter prongs 62 disengage from the rail 10, but for a certain time the longer prongs 61 remain locked against the rail 10 and the lever arm effect they have assists with extraction. The force to be provided to disconnect and extract is also high. The insertion, extraction and unlocking device has then to be moved in terms of translation in order to be able to completely disengage the module.

What is claimed is:

1. A device for inserting, extracting and locking a module into, from and in a rack, said device comprising:

two arms adapted to pivot with respect to the module and which are articulated together by a common articulation, each of the two arms comprising means for anchoring an end thereof into the rack and a non-common articulation adapted to connect with the module;

means for immobilizing the two arms with respect to each other when the two arms are anchored in the rack; and elastic means adapted to be in compression between the module and at least one arm of the two arms when the end of the at least one arm is anchored into the rack.

2. The device according to claim 1, wherein the elastic means comprise at least one element selected from a group consisting of springs and conical washers.

3. The device according to claim 1, wherein the elastic means comprise at least one packet, the at least one packet comprising at least one first conical washer mounted in a first direction, and at least one second conical washer mounted in a second direction, the first direction being opposite the second direction.

4. The device according to claim 1, wherein the non-common articulation specific to a first arm of the two arms comprises a clevis adapted to be secured to the module, the clevis having two branches which support a pivot passing through a slot in the first arm.

5. The device according to claim 4, wherein the slot is oblong to leave the first arm free to move.

6. The device according to claim 1, wherein the non-common articulation specific to a first arm of the two arms comprises a pivot which is adapted to project from the module through a slot in the first arm, the first arm being held on the pivot by a pin which is prevented from translational movement.

7. The device according to claim 6, wherein the slot is oblong to leave the first arm free to move.

8. The device according to claim 1, wherein the elastic means are located in a region of the non-common articulation.

9. The device according to claim 8, wherein the elastic means are slipped onto a pivot.

10. The device according to claim 1, wherein the elastic means are offset with respect to the non-common articulation specific to a first arm of the two arms.

11. The device according to claim 10, wherein the elastic means associated with the first arm is adapted to be slidable along a pivot having a base secured to one element of the module, and a free end which projects toward the first arm, the free end being capped with a cap capable of moving in translation, and the cap compressing the elastic means when the cap comes into abutment against the first arm.

12. The device according to claim 1, wherein the anchoring means are a two-pronged fork, the prongs being adapted to straddle a boss borne by the rack upon anchoring.

13. The device according to claim 12, wherein the prongs have different lengths, a shorter prong being adapted to be received between the boss and the module.

14. The device according to claim 1, wherein the common articulation is a hinge.

15. The device according to claim 14, wherein the common articulation leaves a clearance between the two arms.

16. The device according to claim 1, wherein the means for immobilizing the two arms with respect to each other comprise a notch borne by one of the arms and a hook integral with the other arm, the hook being inserted in the notch.

17. The device according to claim 16, wherein the hook is kept inserted in the notch by an elastic element.

18. The device according to claim 10, wherein the elastic means associated with the first arm is adapted to be slidable along a pivot having a base secured to the first arm, and a free end which projects toward the module, the free end being capped with a cap capable of moving in translation, and the cap compressing the elastic means when the cap comes into abutment against the module.

* * * * *